(12) United States Patent
Shen

(10) Patent No.: US 12,740,008 B2
(45) Date of Patent: Sep. 15, 2026

(54) HEAT DISSIPATING OBJECT WITH SELF SEALING PLUG ALLOWING FOR A THERMAL INTERFACE MATERIAL WITH FLUIDITY FOR AN ELECTRONIC DEVICE

(71) Applicant: Yuci Shen, San Jose, CA (US)

(72) Inventor: Yuci Shen, San Jose, CA (US)

( * ) Notice: Subject to any disclaimer, the term of this patent is extended or adjusted under 35 U.S.C. 154(b) by 539 days.

(21) Appl. No.: 17/843,994

(22) Filed: Jun. 18, 2022

(65) Prior Publication Data

US 2023/0413476 A1 Dec. 21, 2023

(51) Int. Cl.

| | |
|---|---|
| ***H05K 7/20*** | (2006.01) |
| ***H01L 23/367*** | (2006.01) |
| *H01L 23/40* | (2006.01) |

(52) U.S. Cl.

CPC ....... *H05K 7/20272* (2013.01); *H01L 23/367* (2013.01); *H05K 7/20254* (2013.01); *H05K 7/20263* (2013.01); *H01L 2023/4075* (2013.01)

(58) Field of Classification Search

CPC ........... H05K 7/20272; H05K 7/20254; H05K 7/20263; H01L 23/367; H01L 2023/4075

See application file for complete search history.

(56) References Cited

U.S. PATENT DOCUMENTS

2020/0168523 A1* 5/2020 Huang .................... F28F 13/18

* cited by examiner

*Primary Examiner* — Samuel A Gebremariam

(57) ABSTRACT

The disclosure describes a heat-dissipating object allowing for a liquid metal TIM to transfer heat from an electronic device, comprising: a base plate, a storage-tube with a self-sealing plug structure, one or more additional self-sealing plug structures at the base plate, and a sealing ring, wherein the sealing ring is for providing a sealed gap, and the self-sealing plug structures are for filling a liquid metal into the sealed gap and a portion of the storage tube, and then sealing the liquid in them. A heat sink as a heat-dissipating object and a flip chip package as an electronic device are particularly described in details, and a method for filling a liquid into the sealed gap and a portion of the storage tube of the electronic device is also described.

18 Claims, 21 Drawing Sheets

HEAT DISSIPATING OBJECT WITH SELF SEALING PLUG ALLOWING FOR A THERMAL INTERFACE MATERIAL WITH FLUIDITY FOR AN ELECTRONIC DEVICE

TECHNICAL FIELD OF THE DISCLOSURE

The disclosure relates generally to a heat-dissipating object for dissipating heat from an electronic device, and particularly to a heat sink for a flip chip package to use a thermal interface material (TIM) with fluidity at least at an operation temperature of the electronic device.

BACKGROUND OF THE DISCLOSURE

In a flip chip package with a semiconductor chip being a heat-generating object, a thermal interface material (TIM) is usually used to fill the gap between the flip chip and a heat-dissipating object such as a lid or a heat sink for transferring the heat from one to the other. The types of TIM basically include thermal pad, thermal grease, phase change material, and liquid metal. A good TIM needs to have 1) a high thermal conductivity, 2) a good surface wetting capability for reducing the thermal contact resistance, 3) a good gap filling capability, and 4) a good thermal reliability in test or application. A liquid metal as TIM usually includes gallium and gallium alloy. The melting point of gallium is about 29° C., and that of gallium alloy is even lower. The thermal conductivity of liquid metal is much higher than that of the extensively used thermal pad or thermal grease. Furthermore, liquid metal has much better capability for surface wetting and gap filling. So, of all the types of TIM, liquid metal is an ideal TIM based on these first three items. If a liquid metal can be used in a lidded flip chip package, the temperature of the lidded flip chip package can be reduced significantly as compared to other types of TIM. However, the conventional lidded flip chip packages based on a conventional lid of prior arts are limited in their use of liquid metal as its TIM due to the pumping-out issue; that is, when the package is under a thermal cycling test or in its long term of application, the volume of the gap between the flip chip and the lid varies with temperature due to the warpage of the flip chip, causing the liquid metal TIM to be pumped out. The TIM pumping-out issue will cause an incomplete gap filling between the flip chip and the lid, reducing the thermal performance of TIM. And the more important thing is that because a liquid metal is electrically conductive, a small amount of TIM pumping-out may damage the whole electronic device. As a result, a liquid metal type of TIM has not been commercially used in a lidded flip chip package. In general, because of similar reasons, a liquid metal type of TIM is also rarely interposed between heat-dissipating objects (a heat sink, for example) and heat-generating objects (a semiconductor chip, for example) in an electronic device.

For overcoming the liquid TIM pumping-out issue for an electronic device, a heat dissipating object coupled with a storage-tube and one or more air-vent tubes has been disclosed to allow for a liquid thermal interface material to efficiently transfer heat from a flip chip package of the prior art, U.S. Ser. No. 11/177,193 B2. However, this heat dissipating object has three disadvantages in its test and application. The first disadvantage is that the preferred liquid metal TIM, including gallium or its alloys, may get oxidized if it is exposed to oxygen for a long time, which is inevitable since the storage-tube is open to the ambient at all times. The oxidation may accumulate with time and affect the flow of the liquid metal to and from the storage-tube. The second disadvantage is that when the storage-tube is in an upside-down orientation, the liquid metal may leak out and air may be trapped in the sealed gap between the heat dissipating object and the flip chip package. Finally, the third disadvantage is that even though multiple air-vent tubes are recommended, some air may remain in the sealed gap when filling a liquid metal into the sealed gap from the storage-tube. To eliminate these disadvantages, a heat dissipating object coupled with two self-sealing plug structures is described in the present disclosure.

SUMMARY OF THE DISCLOSURE

A heat-dissipating object allowing for a thermal interface material (TIM) with fluidity to transfer heat from an electronic device, comprising: a base plate having a top surface and a bottom surface and one or more self-sealing plug structures, a sealing ring, a liquid-storage tube integrated with a self-sealing plug structure, wherein the sealing ring is mounted at the bottom surface of the base plate, directly sealing a peripheral region of a top surface of the electronic device to provide a sealed gap between a portion of the bottom surface of the base plate and a portion of the top surface of the electronic device; wherein each self-sealing plug structure includes a chamber with a self-sealing block mounted inside; wherein the liquid-storage tube has two ends, one end is connected to the sealed gap through a connecting hole, and another end is integrated with the self-sealing plug structures; wherein the one or more self-sealing plug structures of the base plate are positioned at the top surface of the base plate and connected to the sealed gap through one or more connecting holes; and wherein the sealed gap is entirely filled with a thermal interface material with fluidity, a portion of the liquid-storage tube is filled with the same thermal interface material, and the remaining portion of the liquid-storage tube is filled with a gas.

The heat-dissipating object from Paragraph 4, wherein the thermal interface material with fluidity is formed by a method, which mainly comprises the following steps:

1) Mount the heat dissipating object onto the electronic device;
2) Insert a needle of a vacuum pump tool through the self-sealing plug structure integrated with the liquid-storage tube, and insert a needle of a liquid dispenser through the self-sealing plug structure integrated with the base plate;
3) Pump out the air in the space between the heat-dissipating object and the electronic device, including that in the sealed gap and the liquid-storage tube, by switching the vacuum pump tool to its vacuum condition;
4) Inject the thermal interface material with fluidity into the sealed gap and a portion of the storage tunnel using liquid dispenser, and then remove the needle of the liquid dispenser;
5) Fill a gas into the remaining portion of the storage tunnel by switching the vacuum pump tool to its gas filling condition, and then remove the needle of the vacuum pump tool.

The features and advantages of the embodiments of the present disclosure will become more apparent from the detailed descriptions in conjunction with the drawings below. The drawings and associated descriptions are to illustrate the embodiments of the present disclosure, not to limit the scope of what is claimed.

DETAILED DESCRIPTION OF THE PREFERRED

Figure 1:
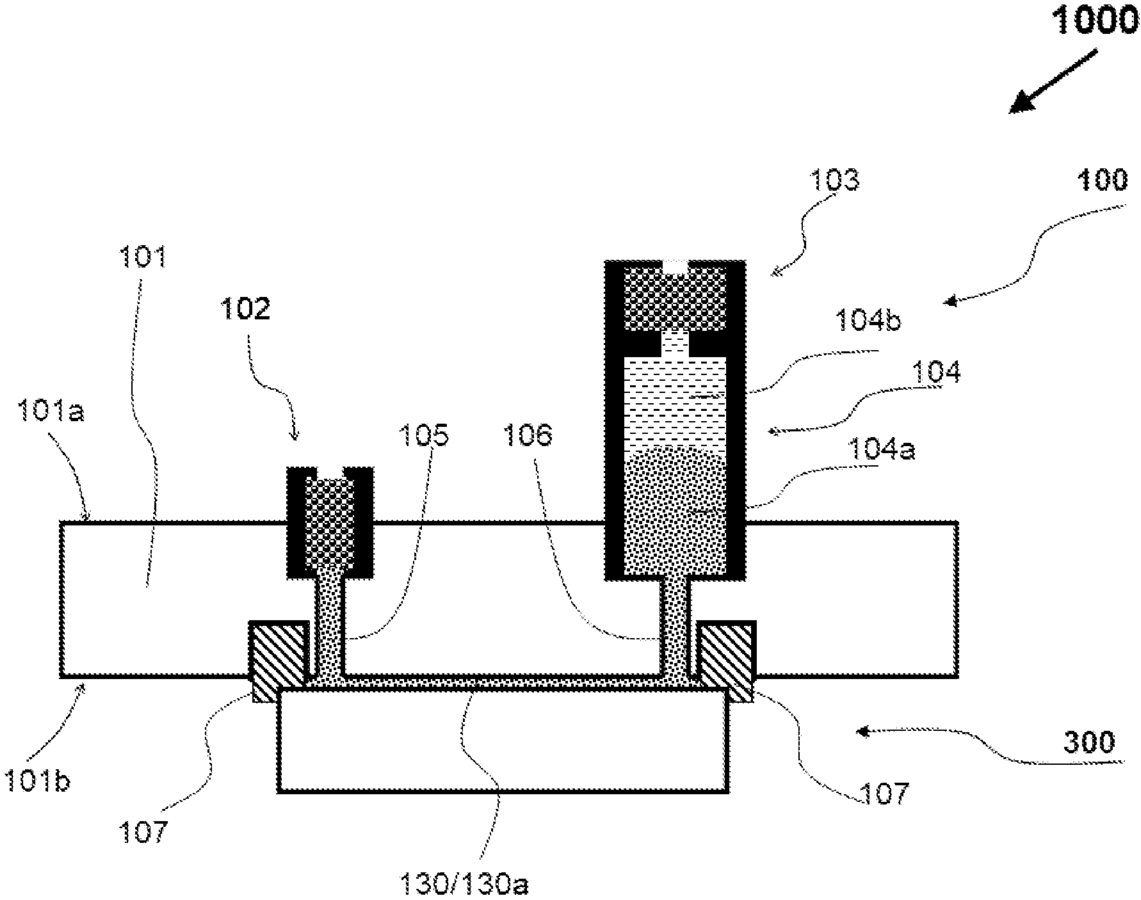
FIG. 1 FIG. 1A and FIG. 1B are schematic diagrams for illustrating a heat dissipating object with a storage-tube as a reservoir and two self-sealing plug structures for dissipating heat from an electronic device via a liquid metal TIM of one preferred embodiment of the present invention.

FIG. 1 is a schematic diagram for illustrating a heat dissipating object with a storage-tube as a reservoir, a sealing ring, and two self-sealing plug structures, which provides a liquid metal TIM to efficiently dissipate heat from an electronic device of one preferred embodiment of the present invention. The numerical symbol 1000 in FIG. 1 designates a heat dissipating object 100 dissipating heat from an electronic device 300 via a liquid metal TIM 130*a*, in which the numerical symbols 100 and 300 respectively designate a heat dissipating object and an electronic device. The base plate 101 of the heat dissipating object 100 has a top surface 101*a* and a bottom surface 101*b*, where a sealing ring 107 is mounted at the bottom surface 101*b*, directly sealing a peripheral region of a top surface of the electronic device 300 so as to provide a sealed gap 130 between a portion of the bottom surface 101*b* of the base plate 101 and a portion of the top surface of the electronic device 300. The sealed gap 130 has a liquid metal TIM 130*a* and two self-sealing plug structures 102 and 103 inside of the sealed gap 130, where the self-sealing plug structure 102 is mounted at a top surface 101*a* of the base plate 101*a* and connected to the sealed gap 130 through a connecting hole 105. A liquid storage tube 104 has an inner end and an outer end, where the inner end is connected to the sealed gap 130 through a connecting hole 106, and the outer end is coupled with the self-sealing plug structure 103. A liquid metal 104*a* is filled in a portion of the liquid-storage tube 104, and a gas 104 is filled in the remaining portion of the liquid-storage tube 104.

Figure 1A:
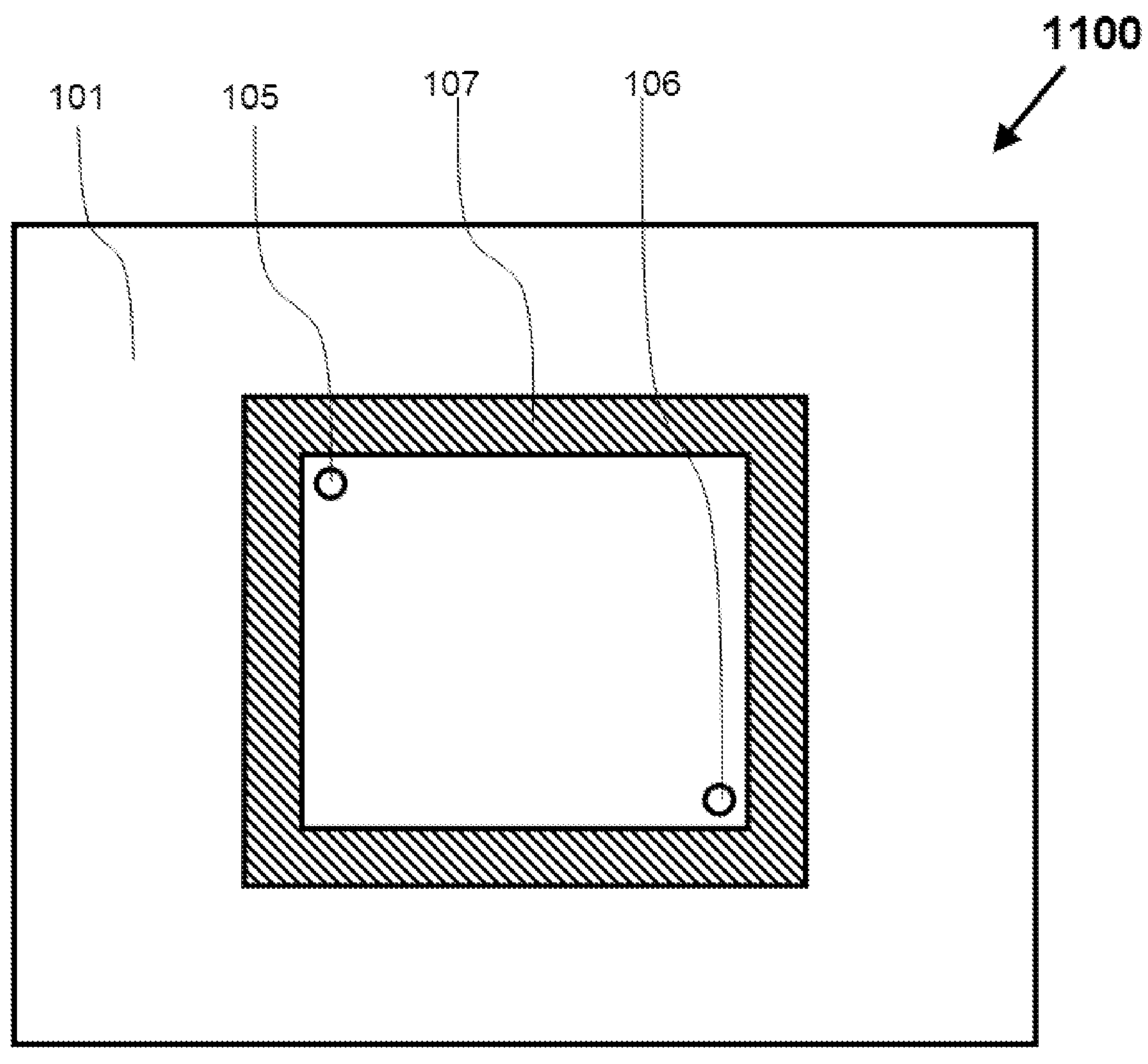
Figure 1B:
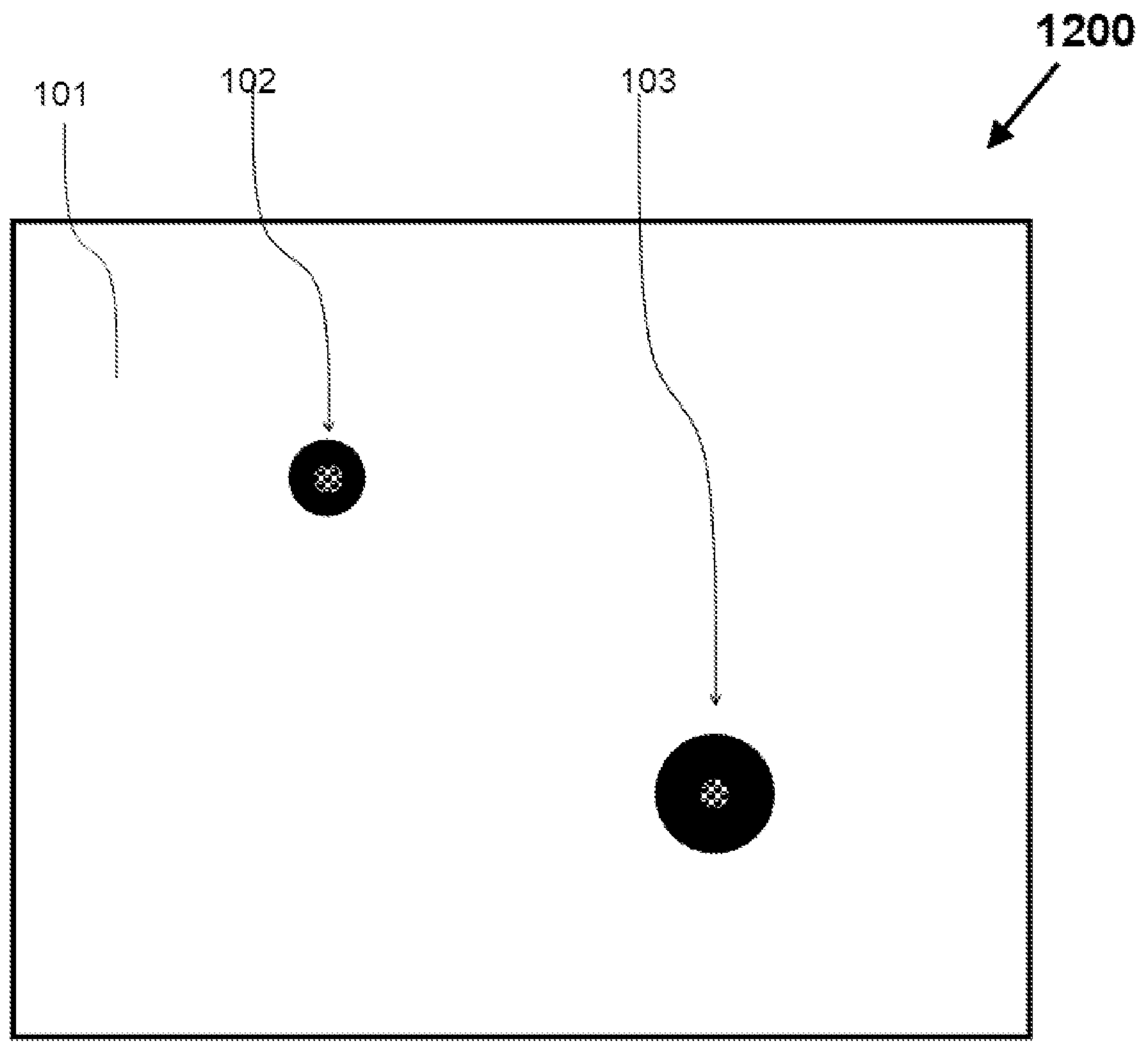

FIG. 1A and FIG. 1B are schematic diagrams for further illustrating the heat dissipating object from its top and bottom views. The numerical symbol 1100 in FIG. 1A designates a bottom view of the heat dissipating object 100 as shown in FIG. 1, in which the same numerical symbols 101, 105, 106 and 107 as those in FIG. 1 are used to designate the same elements from their bottom view. The numerical symbol 1200 in FIG. 1B designates a top view of the heat dissipating object 100 as shown in FIG. 1, in which the same numerical symbols 101, 102 and 103 as those in FIG. 1 are used to designate the same elements from their top view. It is noted that the two self-sealing plug structures only occupy a small portion at the top surface of the base plate 101 of the heat dissipating object 100. So, it is seen that the arrangement of some other elements, such as fins for a heat sink located at the top surface of the base plate 101 for dissipating heat to ambient, will not be significantly affected.

Figure 1C:
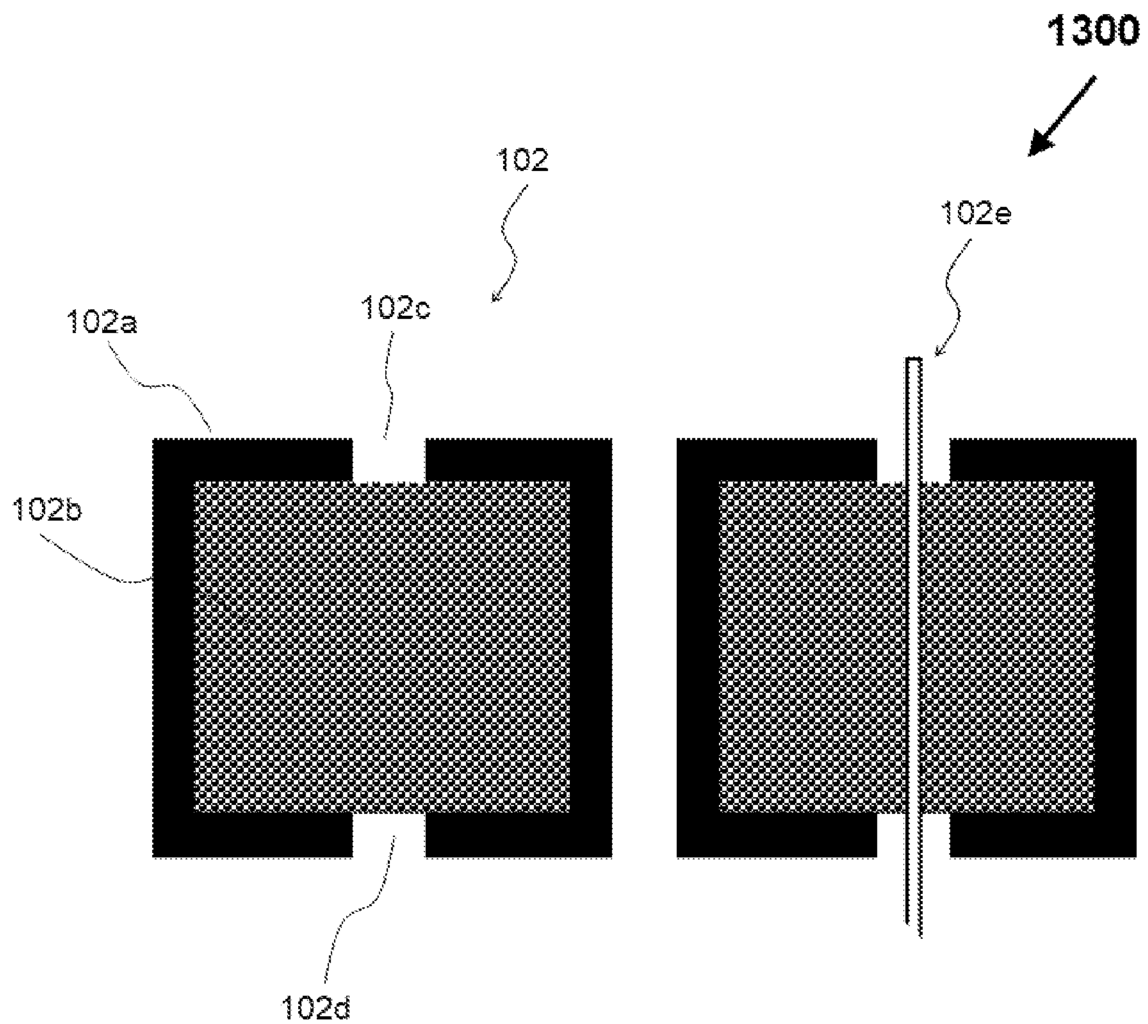
FIG. 1C, FIG. 1D and FIG. 1E are schematic diagrams for further illustrating a self-sealing plug structure.

FIG. 1C is a schematic diagram for illustrating the features of a self-sealing plug structure of the heat dissipating object of one preferred embodiment of the present invention. The numerical symbol 1300 in FIG. 1C designates an enlarged view of the self-sealing plug structure 102 as shown in FIG. 1, in which a chamber 102*a* respectively has two aligned holes 102*c* and 102*d* at its top and bottom sides, a self-sealing block 102*b* is enclosed and locked in the chamber 102*a*, and the self-sealing block 102*b* can become sealed by itself after a needle is inserted into then removed from it as illustrated by 102*e*. One preferred option for a self-sealing block is a rubber block with a larger size than the chamber 102*a* so that the rubber block is tightly locked inside the chamber 102*a* after being squeezed into it. The features of the self-sealing plug structure 103 coupled with the storage-tube 104 are similar as those of the 102, and are not repeated herein.

Figure 1D:
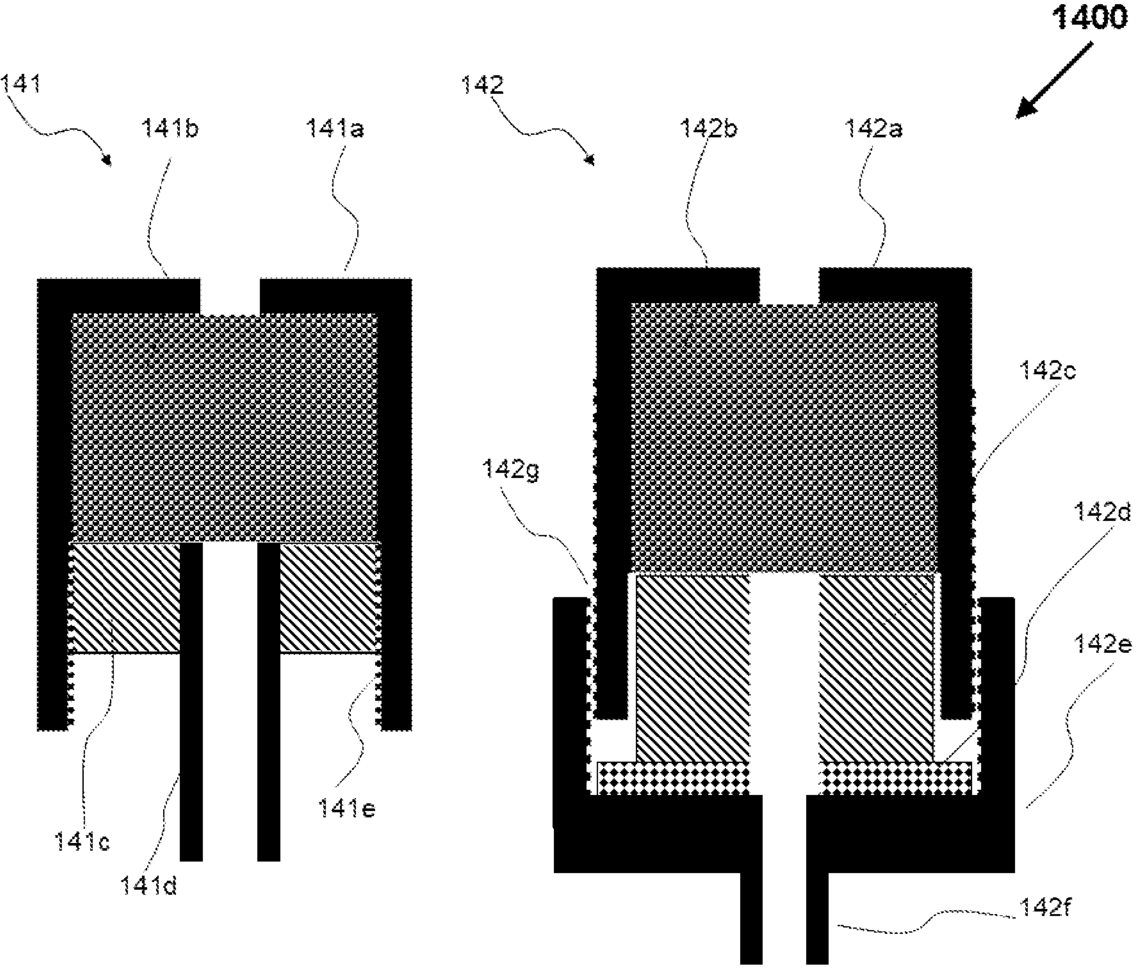
Figure 1E:
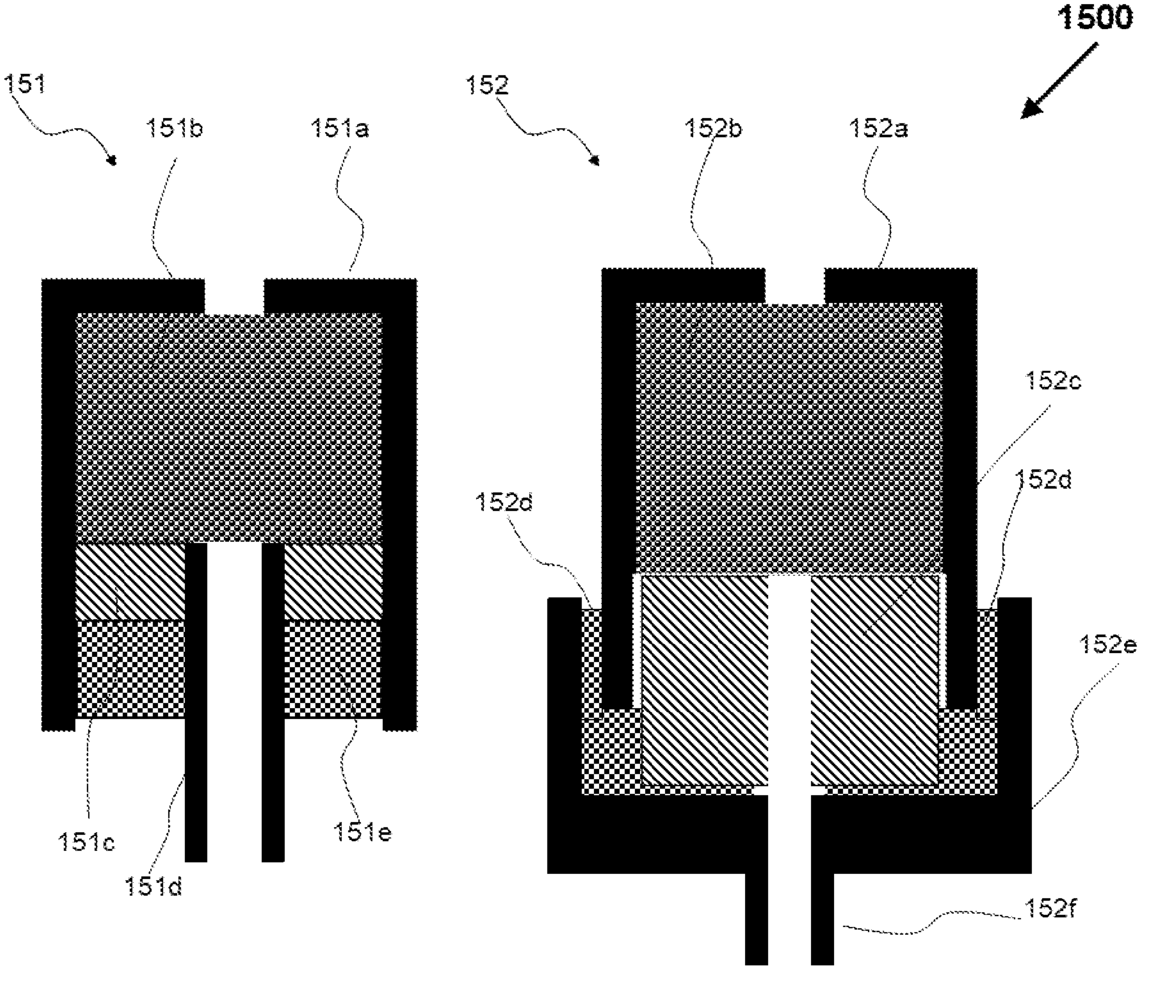

FIG. 1D and FIG. 1E are schematic diagrams for illustrating two particular designs for a self-sealing plug structure. The numerical symbol 1400 in FIG. 1D designates two self-sealing plug structures 141 and 142. The self-sealing plug structure 141 comprises a screw cup 141*a* with a hole at its bottom, a self-sealing block 141*b*, and a piston 141*c* with a tube 141*d*, wherein the self-sealing block 141*b* is tightly compressed inside the cup 141*a* by moving the piston 141*c* into the cup 141*a* along the screw threads 141*e*. The self-sealing plug structure 142 comprises a screw cup 142*a* with a hole at its bottom, a self-sealing block 142*b*, and a piston 143*c*, another screw cup 142*e* with a tube 142*f*, and a sealing pad 142*d*, wherein the self-sealing block 142*b* is tightly compressed inside the cup 142*a* by moving the screw cup 142*e* upwards along the screw threads 142*g*. The numerical symbol 1500 in FIG. 1E designates two self-sealing plug structures 151 and 152. The self-sealing plug structure 151 comprises a screw cup 151*a* with a hole at its bottom, a self-sealing block 151*b*, and a piston 151*c* with a tube 151*d*, wherein the self-sealing block 151*b* is tightly compressed inside the cup 151*a* by pushing and fixing the piston 151*c* into the cup 151*a* through an adhesive or solder material 151*e*. The self-sealing plug structure 152 comprises a screw cup 152*a* with a hole at its bottom, a self-sealing block 152*b*, and a piston 152*c*, and another cup 152*e* with a tube 152*f*, wherein the self-sealing block 152*b* is tightly compressed inside the cup 152*a* by pushing and fixing the piston 152*c* in the two cups 152*a* and 152*e* through an adhesive or solder material 152*d*.

Figure 2:
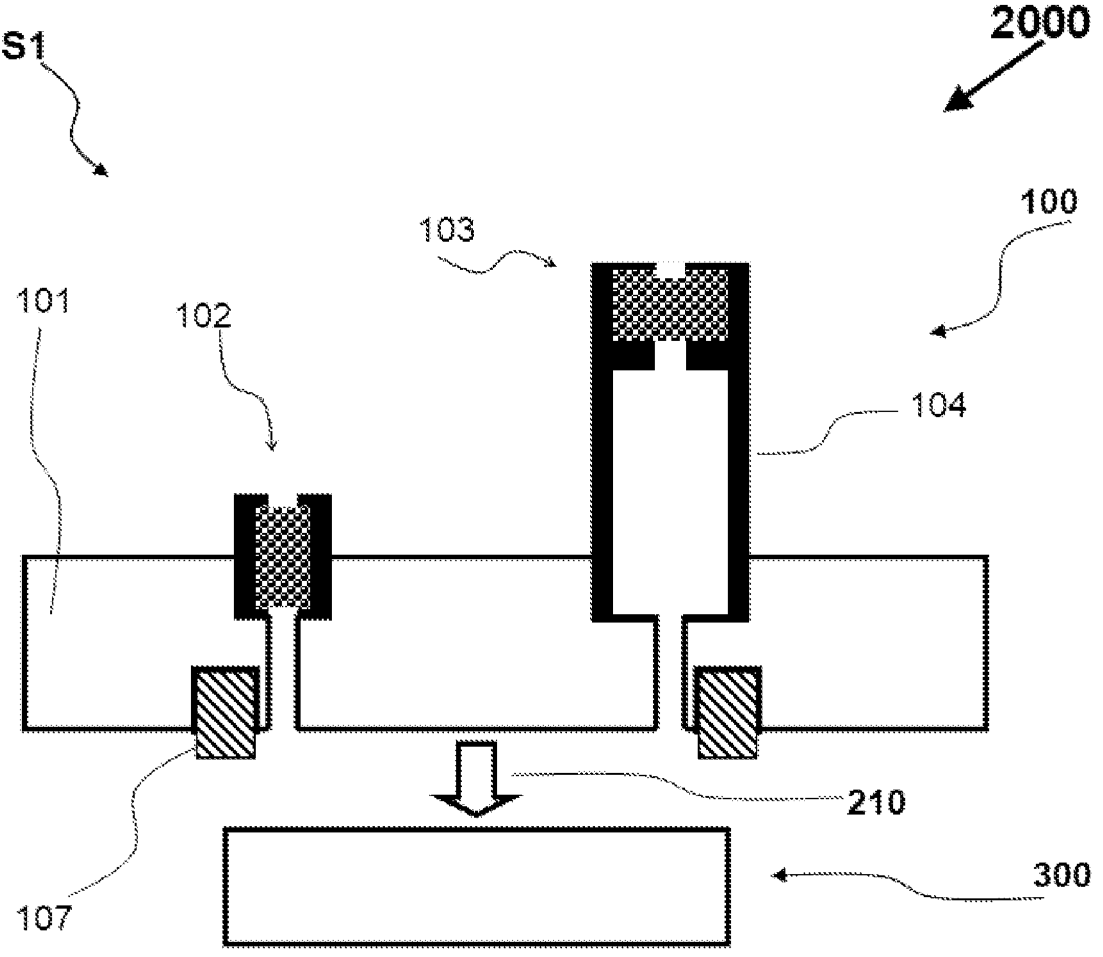
FIG. 2 to FIG. 10 are schematic diagrams for illustrating a method to form a heat dissipating object allowing for a liquid metal TIM to transfer heat from an electronic device of another preferred embodiment of the present invention.
Figure 3:
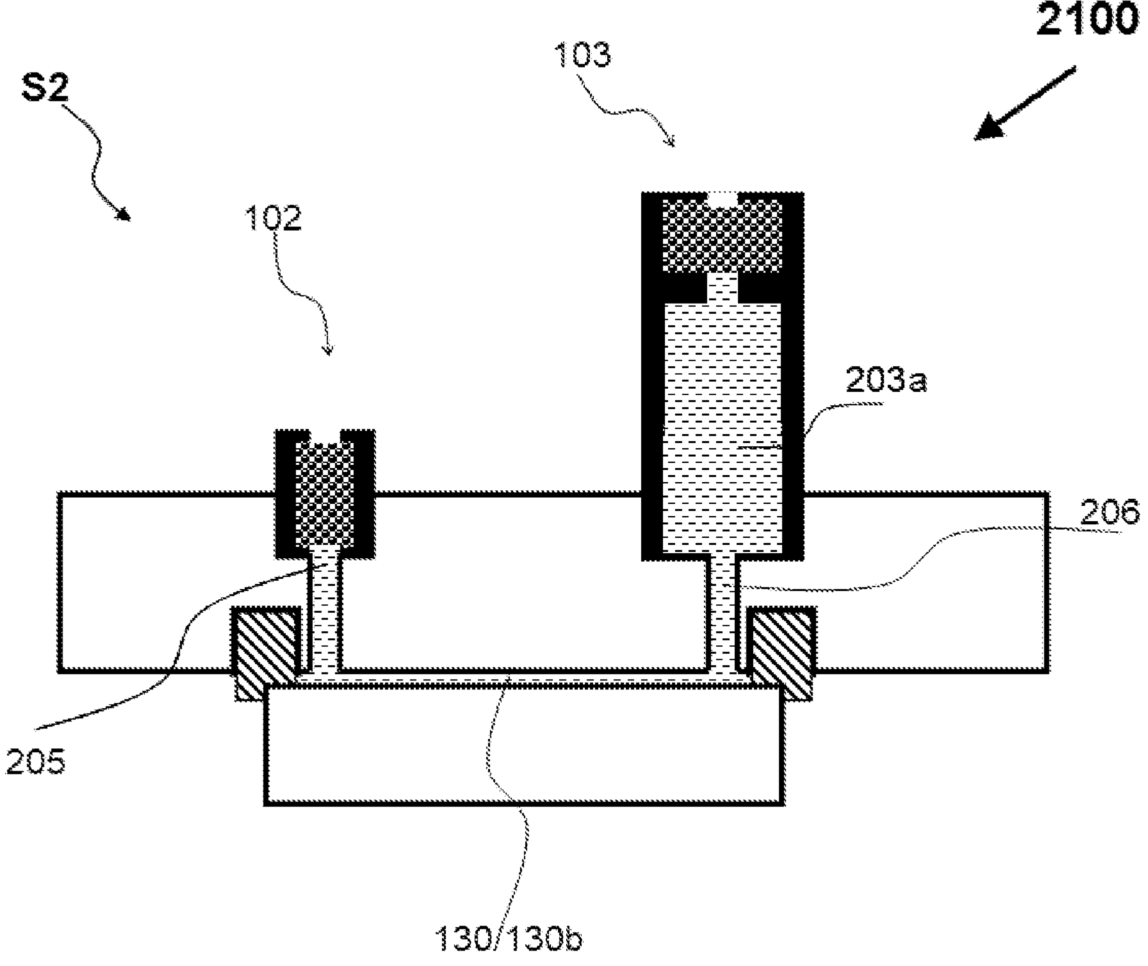
Figure 4:
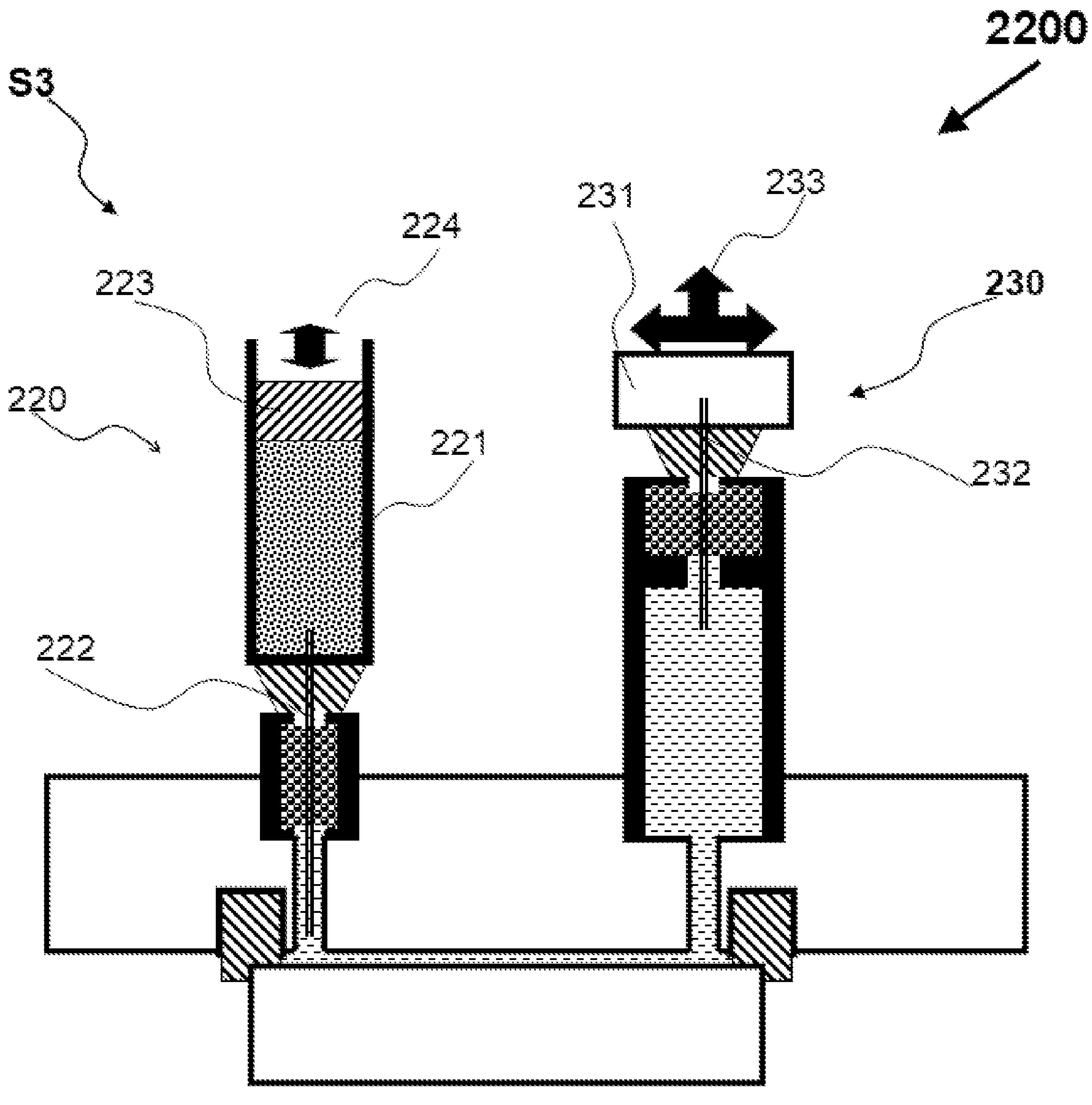
Figure 5:
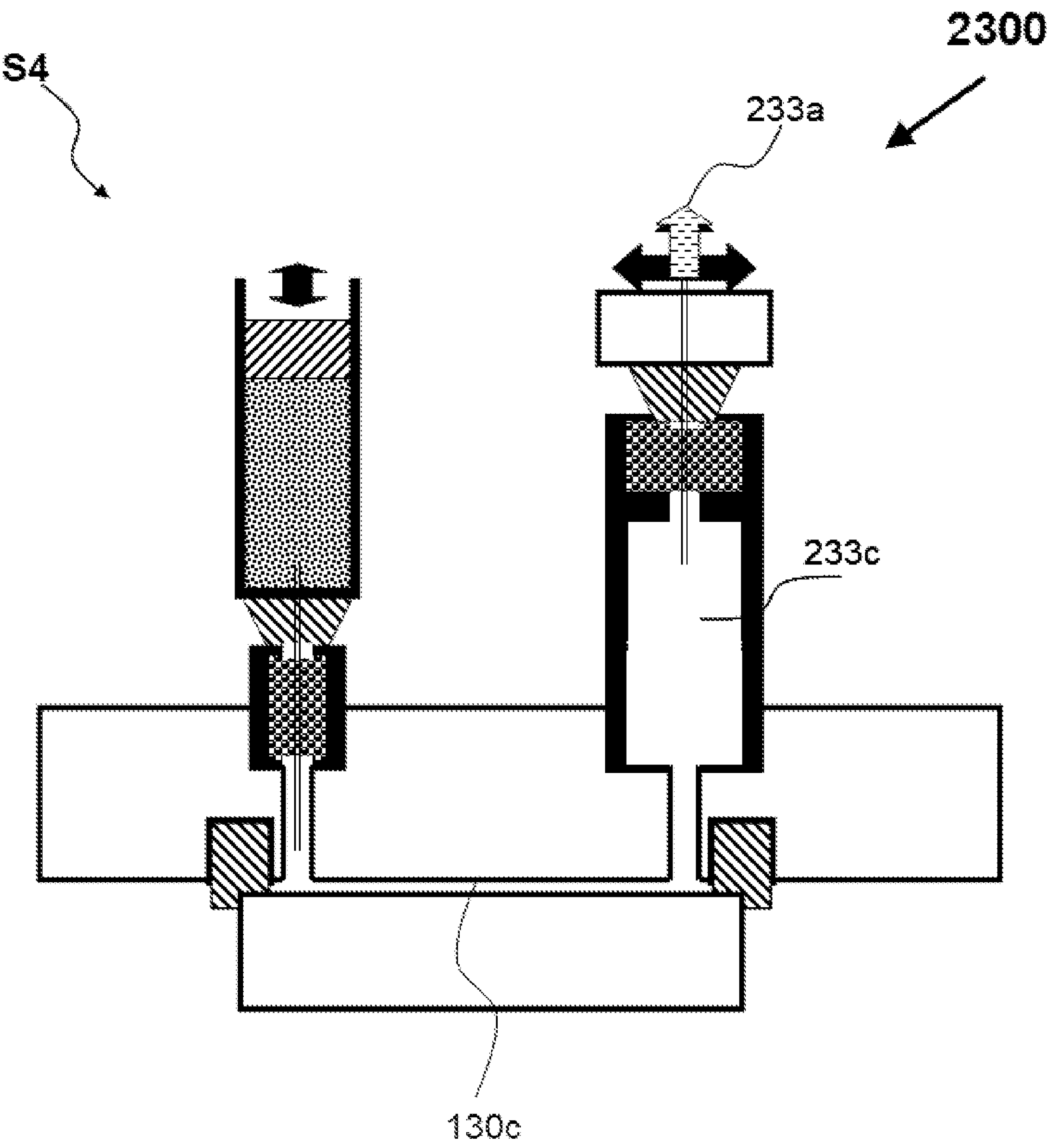

FIG. 2 to FIG. 10 are schematic diagrams for illustrating a method to form a heat dissipating object allowing for a liquid metal TIM to transfer heat from an electronic device of another preferred embodiment of the present invention. The method mainly comprises the following Steps 1 to 7 as illustrated by FIG. 2 for Step 1, FIG. 3 for Step 2, FIG. 4 for Step 3, FIG. 5 for Step 4, FIG. 6 and FIG. 7 for Step 5, FIG. 8 and FIG. 9 for Step 6, and FIG. 10 for Step 7, which are described in the following:

The numerical symbol 2000 in FIG. 2 is for illustrating Step 1:

1) Prepare a heat dissipating object 100 according to an electronic device 300, wherein the heat dissipating object 100 (also referring to FIG. 1) includes: a base plate 101, a sealing ring 107, a storage-tube 104 coupled with a self-sealing plug structure 103, and another self-sealing plug structure 102, and the electronic device 300 includes a top surface, from which the heat of the electronic device 300 dissipates to the heat dissipating object 100;

The numerical symbol 2100 in FIG. 3 is for illustrating Step 2:

2) Mount the heat dissipating object 100 onto the top surface of the electronic device 300 as shown by the arrow 210 in FIG. 2 so that the sealing ring 107 seals a peripheral region of a top surface of the electronic device 300 and provides a sealed gap 130 as shown in FIG. 3, in which the numerical symbols 130*b*, 203*a*, 205 and 206 designate air trapped in the space between the heat dissipating object 100 and the electronic device 300;

The numerical symbol 2200 in FIG. 4 is for illustrating Step 3:

3) Prepare a liquid metal dispenser 220, which includes a liquid metal container 221 with a piston 223, a needle tip 222, and a moving controller as illustrated by the arrow 224 for controlling the movement of the piston 223, and insert the needle tip 222 through the self-sealing plug structure 102 and into the connecting hole 105; and prepare a vacuum pump tool 230, which includes a vacuum pump 231 with a gas controller as illustrated by the 3-way arrow 233 and a needle tip 232, and insert the needle tip 232 through the self-sealing plug structure 103 and into the storage-tube 104;

The numerical symbol 2300 in FIG. 5 is for illustrating Step 4:

4) Pump out the air to achieve a vacuum condition in the sealed gap and the storage-tube as shown by the numerical symbols 130*c* and 233*c* by switching the gas controller 233 of the vacuum pump tool 230 to a vacuum condition as illustrated by the gas arrow 233*a;*

Figure 6:
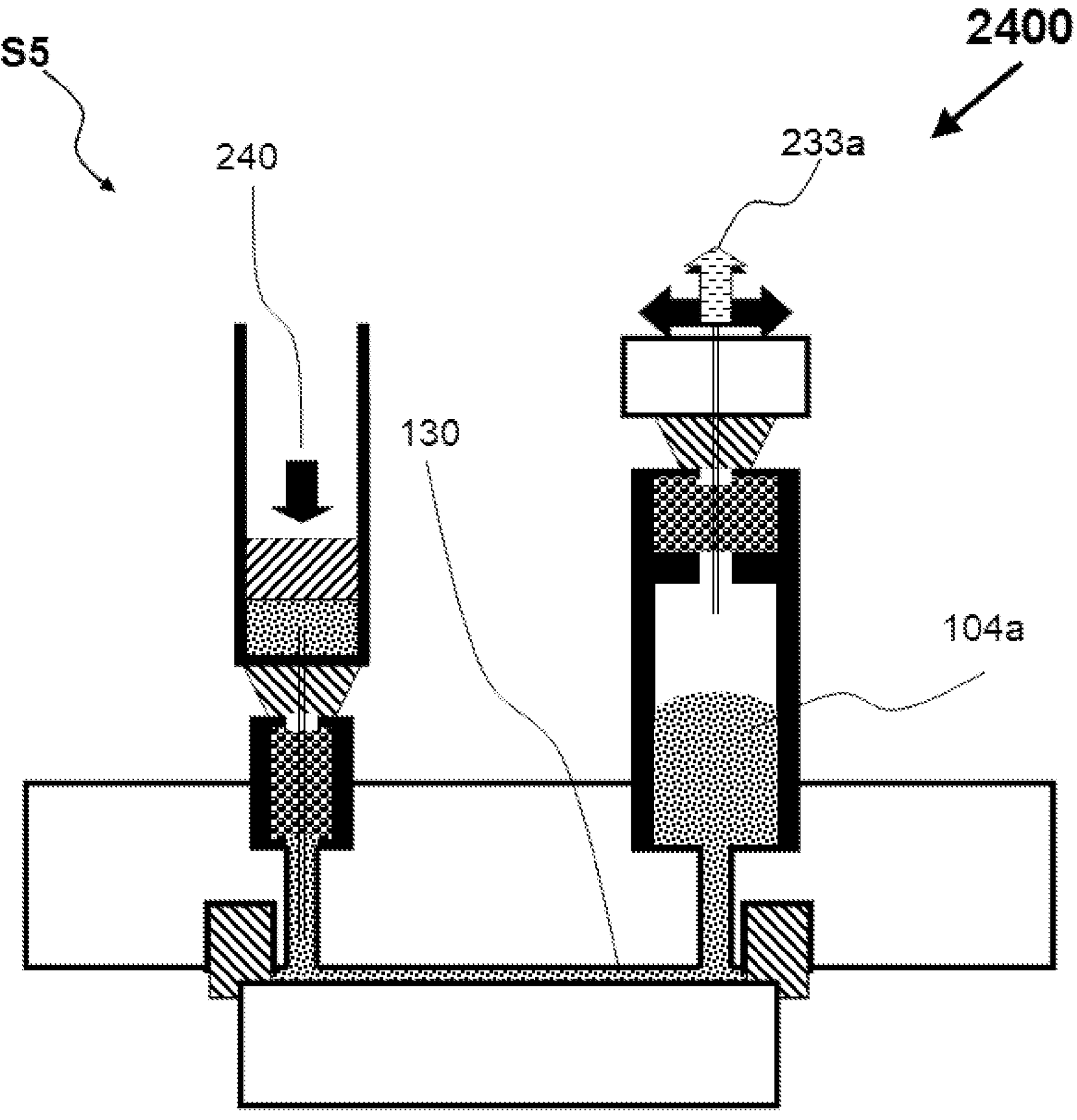
Figure 7:
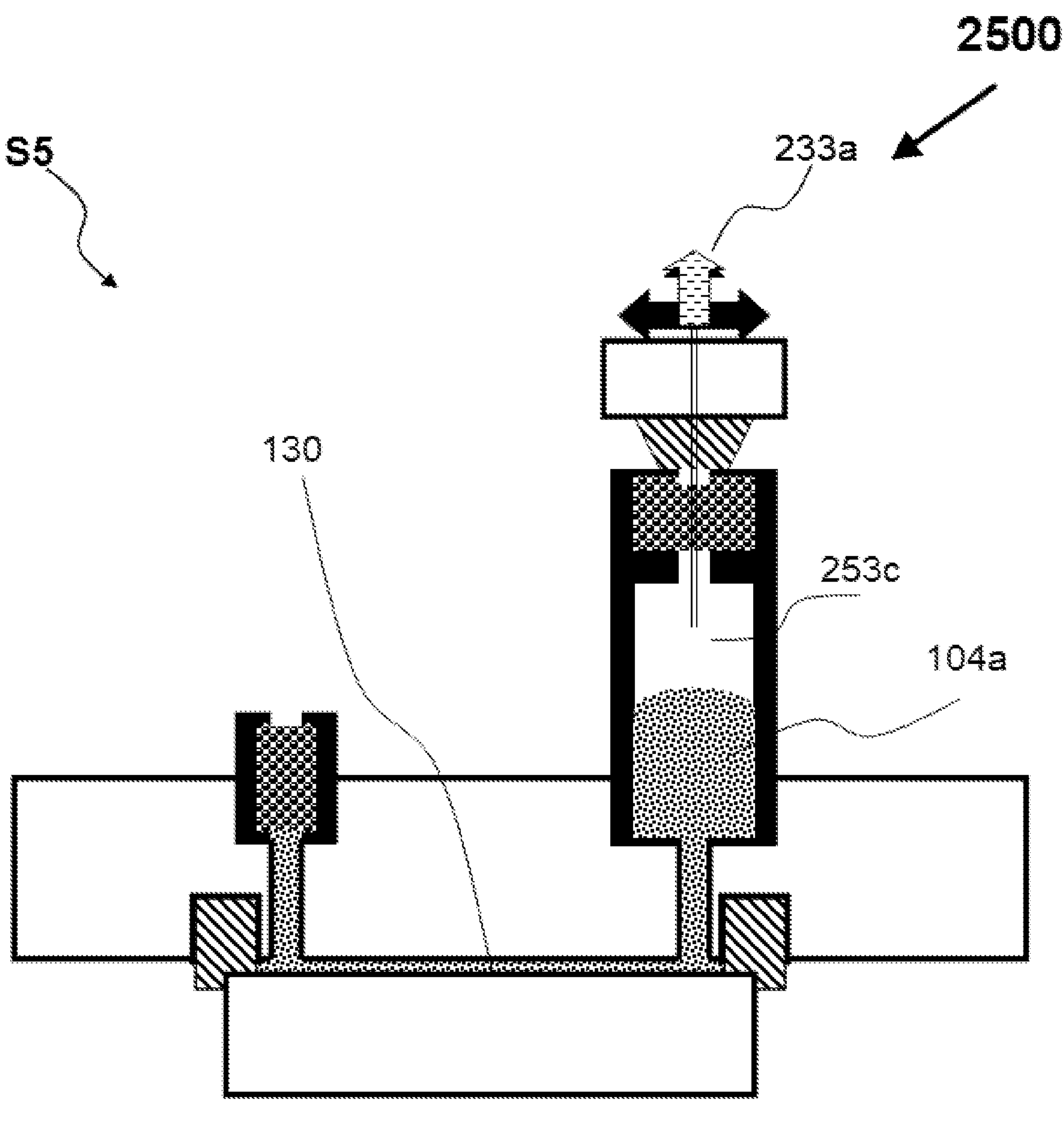
Figure 8:
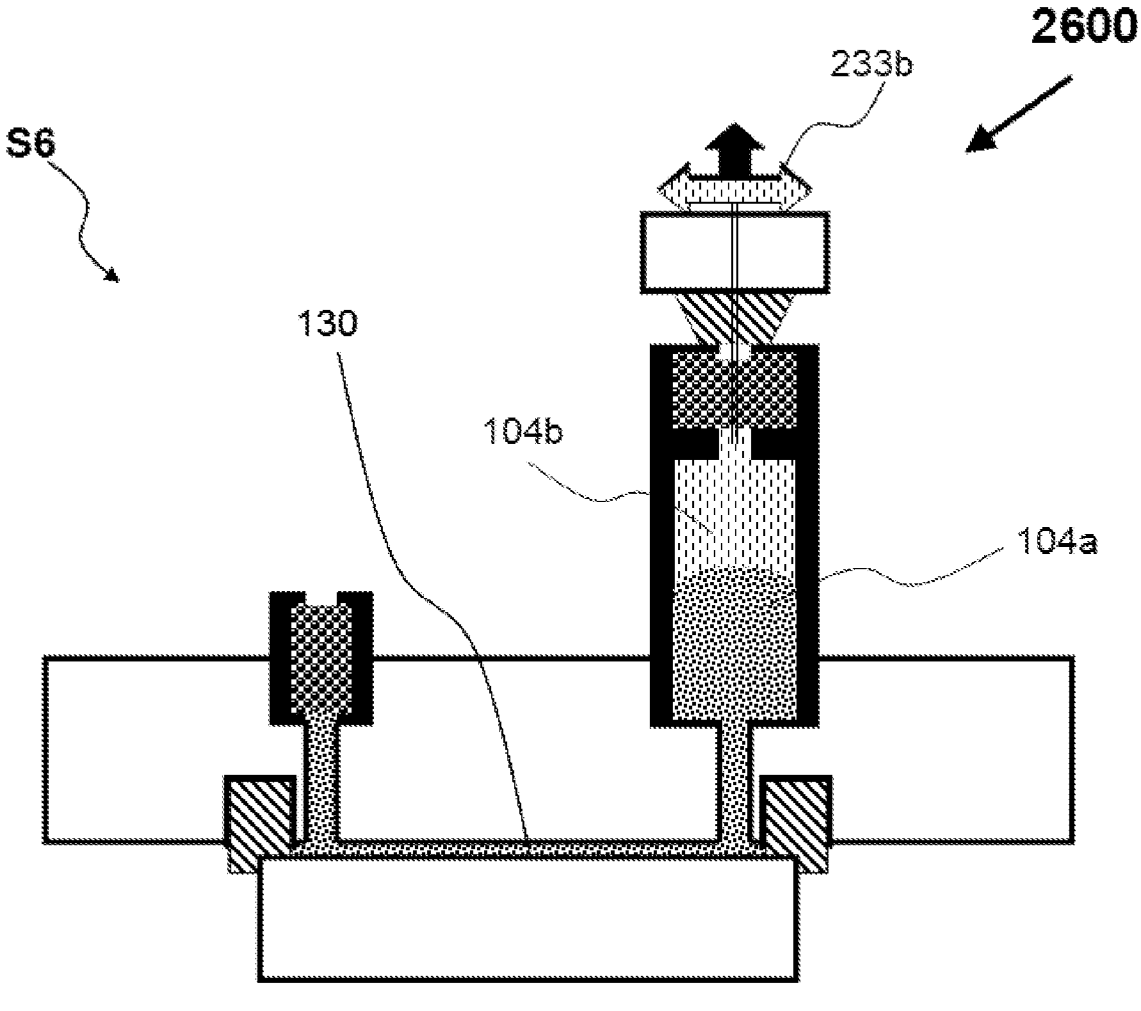
Figure 9:
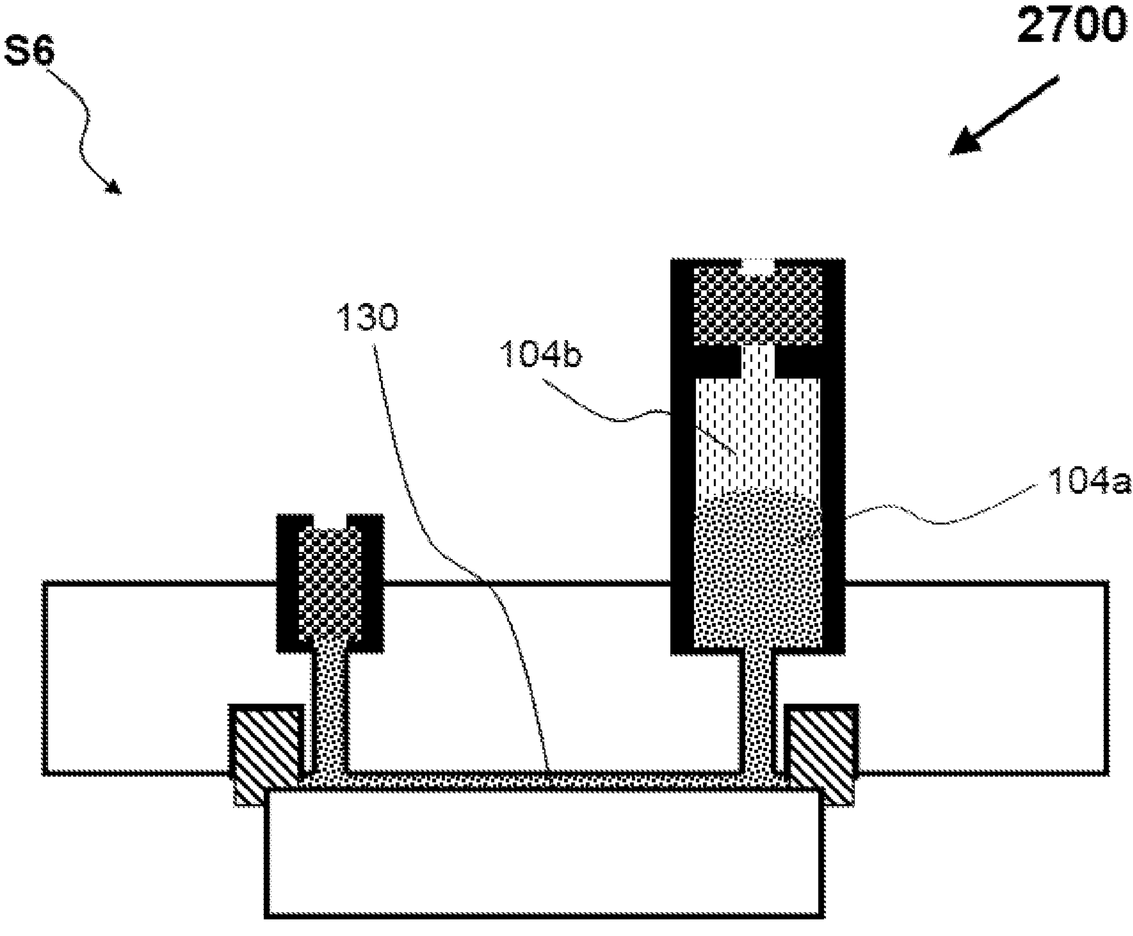
Figure 10:
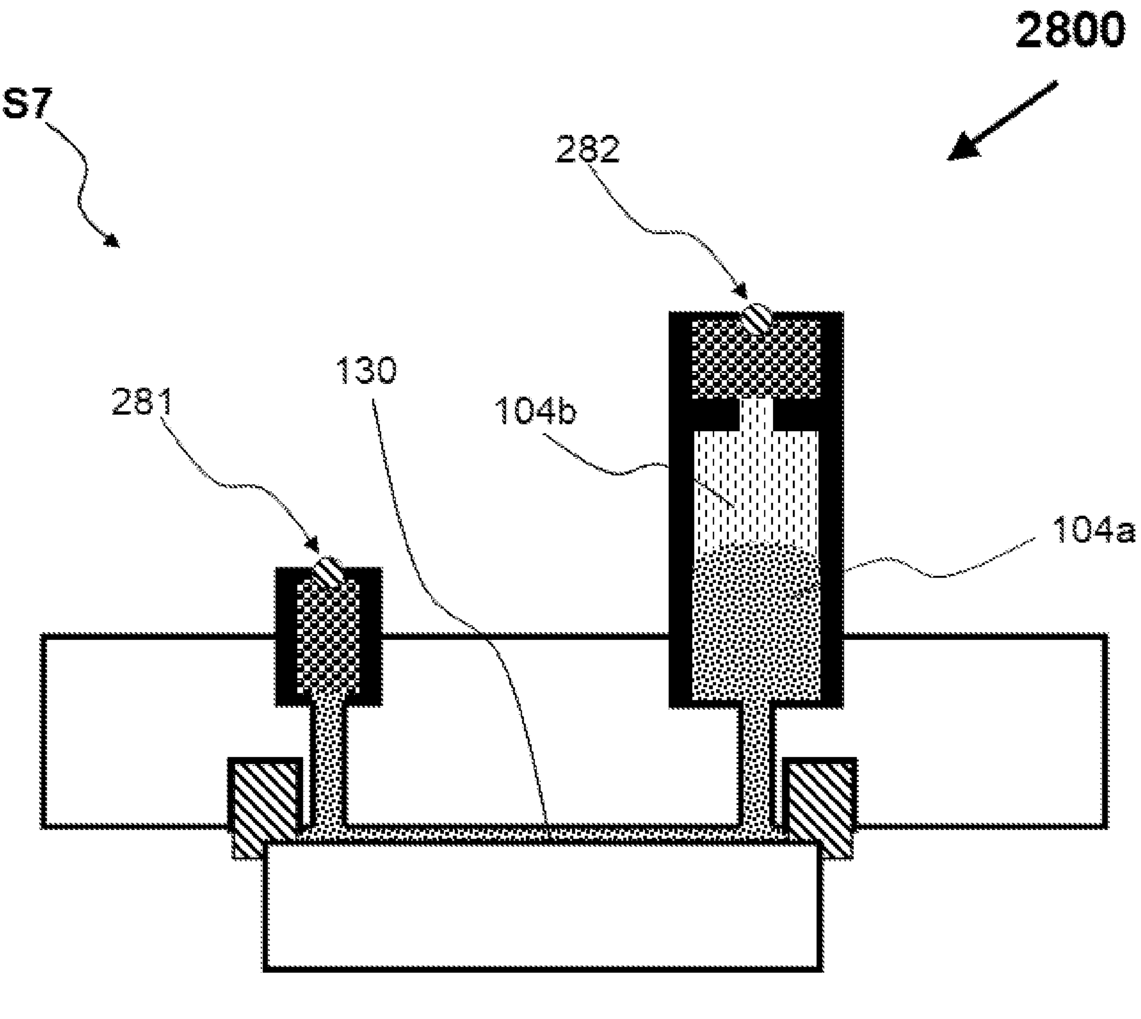

The numerical symbol 2400 and 2500 in FIG. 6 and FIG. 7 are for illustrating Step 5:

5) Inject the liquid metal from the liquid metal dispenser 220 into the sealed gap 130 and a portion of the storage-tube 104*a* by pushing the piston as shown by the arrow 240 in FIG. 6, and then remove the needle tip of the liquid metal dispenser from the self-sealing plug structure 102 as shown in FIG. 7;

The numerical symbols 2600 and 2700 in FIG. 8 and FIG. 9 are for illustrating Step 6:

6) Fill a gas in the remaining portion 104*b* of the storage-tube as illustrated by the gas arrow 233*b* in FIG. 8 by switching the vacuum pump tool 230 to a gas filling condition, and then remove the needle tip of the vacuum pump tool from the self-sealing plug structure as shown in FIG. 9;

The numerical symbol 2800 in FIG. 10 is for illustrating Step 7:

7) Put a drop of adhesive or glue in one or more holes of the two self-sealing plug structures as illustrated by the numerical symbol 281 and/or 282 in FIG. 10.

It is noted that the Step 7 described in FIG. 10 is optional, and is for further sealing the self-sealing plug structures. Furthermore, the step to put a drop of adhesive or glue in the hole of the self-sealing plug structure as illustrated by the numerical symbol 281 and/or 282 can be performed after the previous Step 5, i.e., put a drop of adhesive or glue in the hole after right after removing the needle tip of the liquid metal dispenser from the self-sealing plug structure 102 as shown in FIG. 7.

Figure 11:
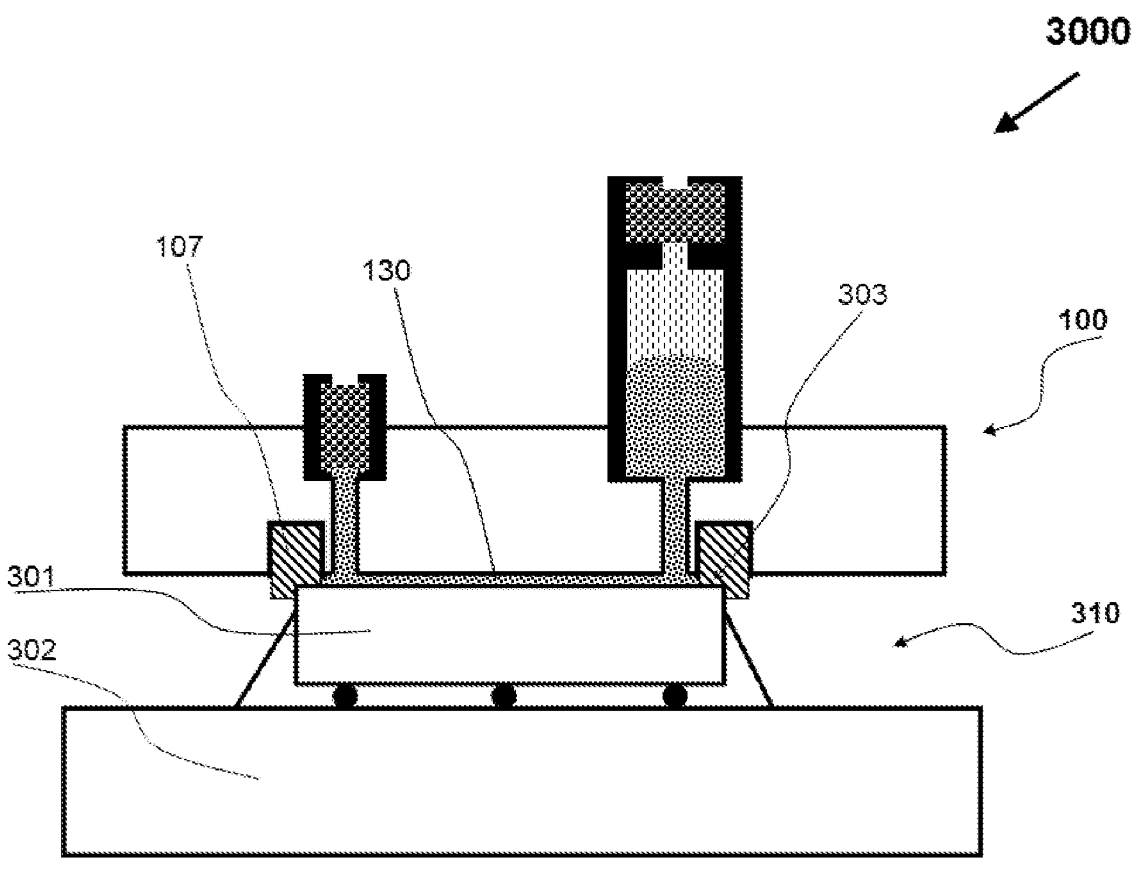
FIG. 11 is a schematic diagram for illustrating that the electronic device is particularly a flip chip package of one preferred embodiment of the present invention.

FIG. 11 is a schematic diagram for illustrating that the electronic device is particularly a flip chip package of one preferred embodiment of the present invention. The numerical symbol 3000 in FIG. 11 designates a heat dissipating object allowing for a liquid metal TIM to transfer heat from a flip chip package of one preferred embodiment of the present invention, in which a flip chip package 310 includes a flip chip 301 and a substrate 302, and 303 designates that the sealing ring 107 directly seals a peripheral edge region of a top surface of the flip chip 301 so as to provide a sealed gap 130 between a portion of the bottom surface of the base plate 101 and a portion of the top surface of the flip chip 301.

Figure 12:
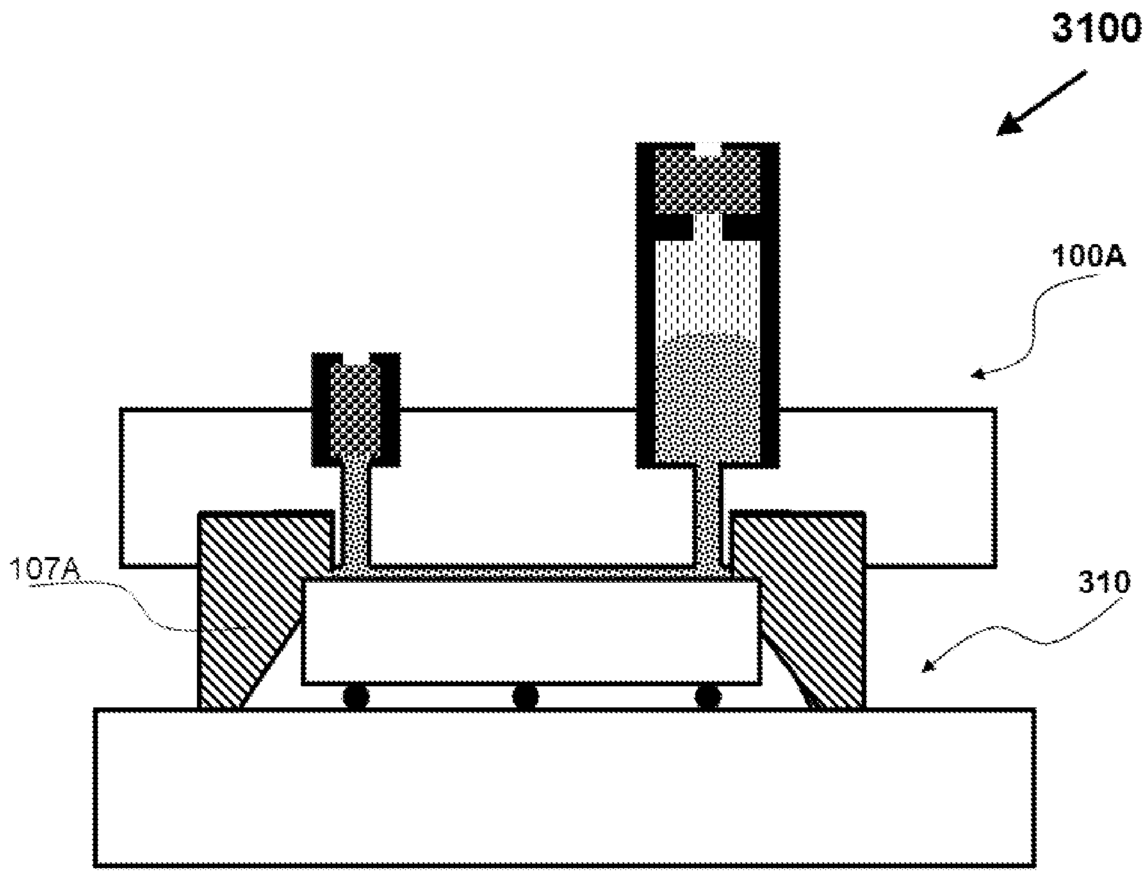
FIG. 12 is a schematic diagram for illustrating another design for the sealing ring for the case that the electronic device is particularly a flip chip package of one embodiment of the present invention.

FIG. 12 is a schematic diagram for illustrating another design for the sealing ring for the case that the electronic device is particularly a flip chip package of one embodiment of the present invention. The numerical symbol 3100 in FIG. 12 designates a heat dissipating object 100A with a sealing ring 107A allowing for a liquid metal TIM to transfer heat from a flip chip package of one preferred embodiment of the present invention, in which the sealing ring 107A seals a peripheral edge region of a top surface of the flip chip 301 and a region of the substrate surrounding the flip chip so as to provide a safer sealing and also mechanically protect the edge region of the flip chip.

Figure 13:
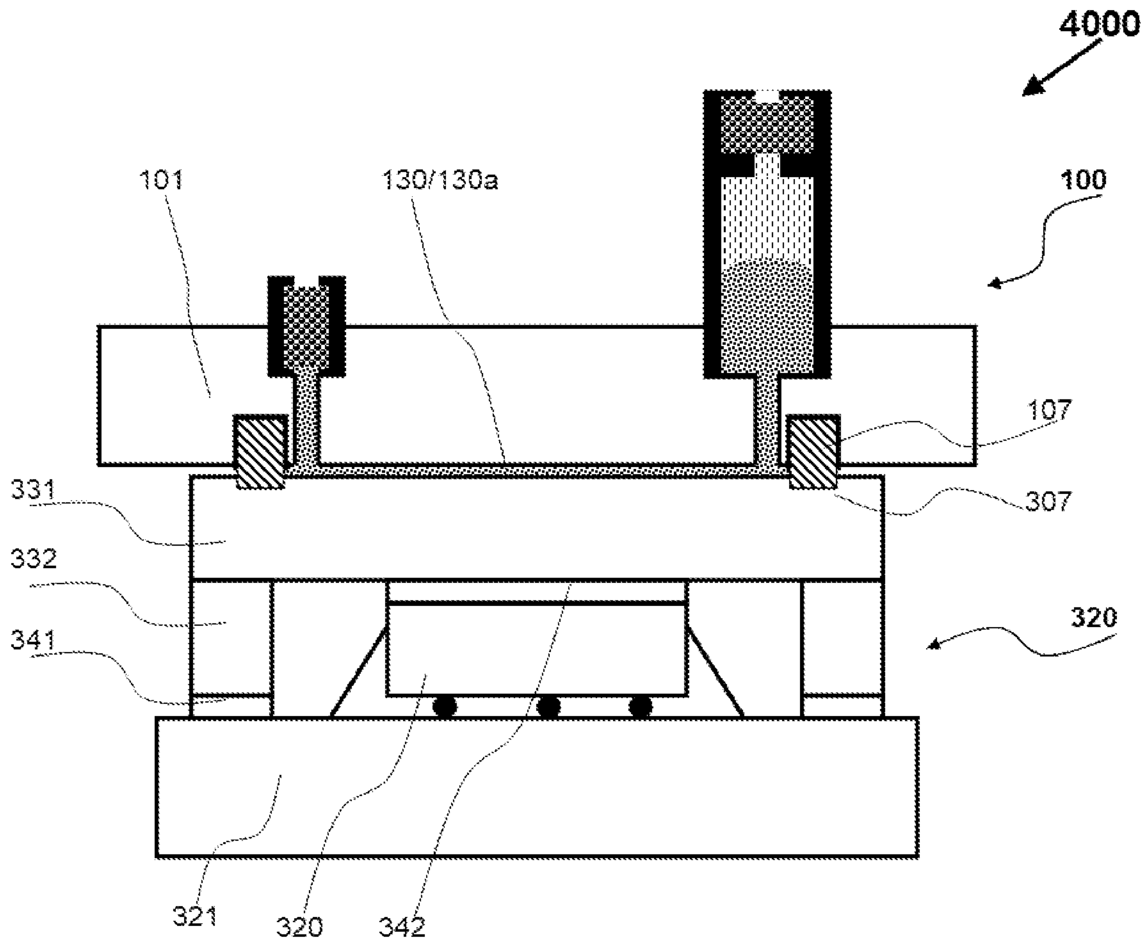
FIG. 13 is a schematic diagram for illustrating that the electronic device is particularly a lidded flip chip package of another preferred embodiment of the present invention.

FIG. 13 is a schematic diagram for illustrating that the electronic device is particularly a lidded flip chip package of another preferred embodiment of the present invention. The numerical symbol 4000 in FIG. 13 designates a heat dissipating object allowing for a liquid metal TIM to transfer heat from a lidded flip chip package of one preferred embodiment of the present invention, in which a lidded flip chip package 320*a* comprises: a lid including a top piece 331 and a foot 332 and a flip chip package including a flip chip 320 and a substrate 321, wherein the lid is attached onto the flip chip package through an adhesive 341, and a thermal interface material (TIM) 342. The heat generated by the flip chip will mainly transfer to the lid through the TIM 342, and then transfer to the dissipating object 100 through the liquid metal TIM 130*a*. The numerical symbol 307 in FIG. 13 designates that the sealing ring 107 seals a peripheral region of a top surface of the top piece 331 of the lid so as to provide a sealed gap 130 between a portion of the bottom surface of the base plate 101 and a portion of the top surface of the top piece 331. It is noted that the sealing ring 107 can be flexibly designed for the case of a lidded flip chip package by following a basic guidance, i.e., a peripheral region of a top surface of the top piece 331 sealed by the sealing ring 107 should be outside the region of the flip chip. An optional ring-form of notch 307 is also shown at the top surface of the top piece 331 such that the sealing ring can be placed inside it.

Figure 14:
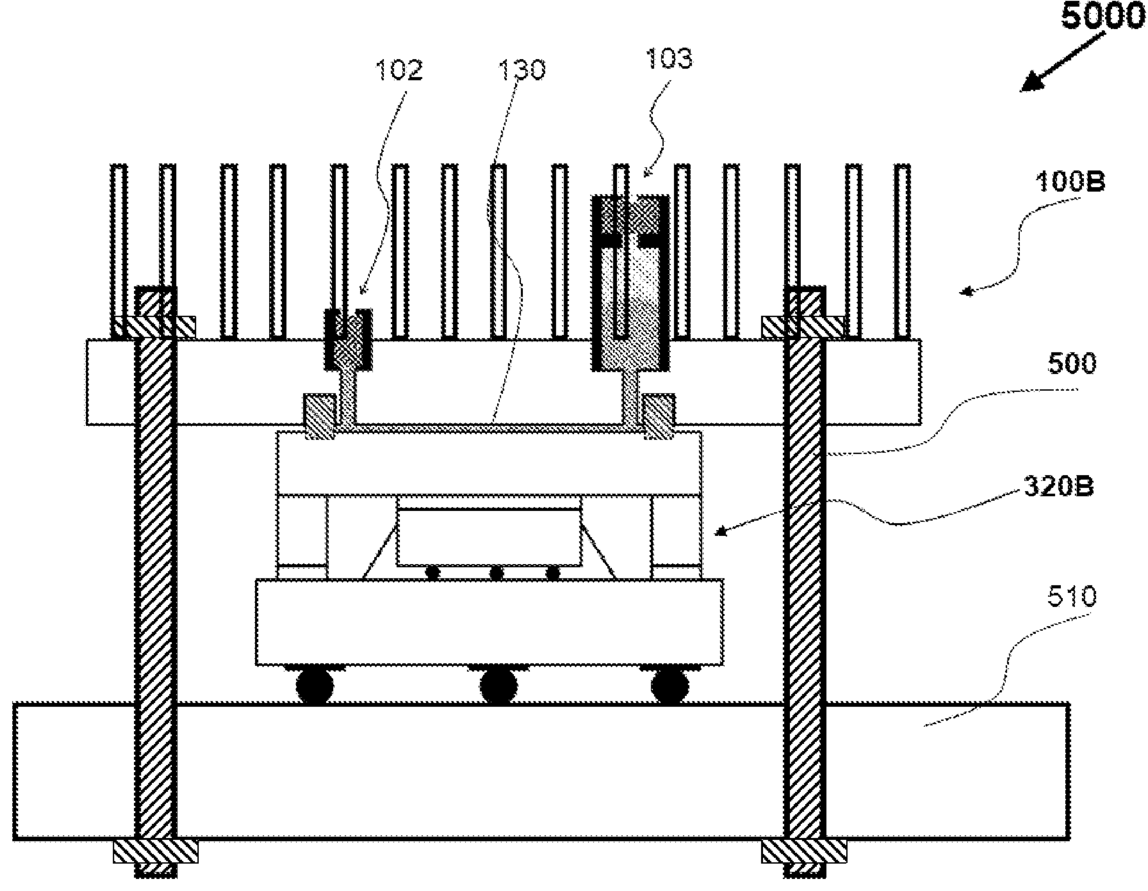
FIG. 14 is a schematic diagram for illustrating a heat sink allowing for a liquid metal TIM to dissipate heat from a lidded flip chip package of one preferred embodiment of the present invention.

FIG. 14 is a schematic diagram for further illustrating a heat dissipating object allowing for a liquid metal TIM to transfer heat from a lidded flip chip package of one preferred embodiment of the present invention. The numerical symbol 5000 in FIG. 14 designates a heat sink as a heat dissipating object, in which a heat sink 100B is coupled with two self-sealing plug structures 102 and 103, the self-sealing plug structure 102 is mounted in the base plate of the heat sink 100B, and the self-sealing plug structure 103 is mounted at the outer end of the storage-tube. The lidded flip chip package 320B is mounted on a PCB (printed circuit board) 510, the heat sink 100B is mounted over the lidded flip chip package 320B through a fixture 500 between the heat sink 320B and the PCB 510 so that a pressure can be applied on the sealing ring for it to be clamped between the heat sink and the lid to form a sealed gap 130. It is noted that the heat dissipating object in the present invention can particularly be a vapor chamber or a cold plate, which can be similarly coupled with two self-sealing plug structures, a sealing ring and a storage-tube to allow for a liquid metal TIM to efficiently transfer heat from an electronic device, like a lidded flip chip package.

Figure 15:
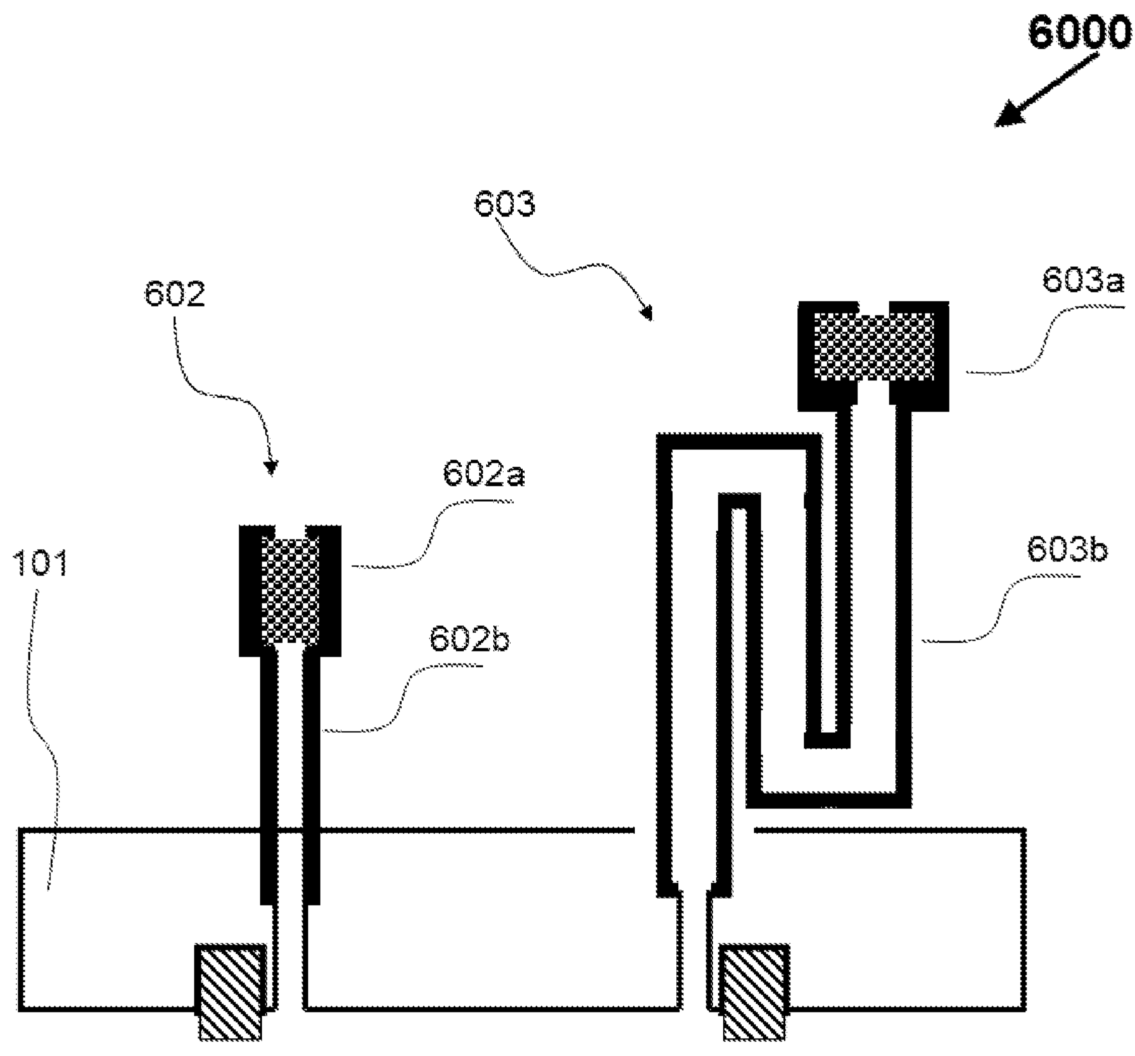
FIG. 15 is a schematic diagram for illustrating a heat dissipating object coupled with a folding-form of storage-tube of another preferred embodiment of the present invention.

FIG. 15 is a schematic diagram for illustrating a heat dissipating object coupled with a folding-form of storage-tube and a self-sealing plug structure with a connecting tube of another preferred embodiment of the present invention. The numerical symbol 6000 in FIG. 15 designates a heat dissipating object, in which the numerical symbol 603 designates a folding-form of storage-tube 603*b* coupled with a self-sealing plug structure 603*a* at its outer end, and 602 designates a self-sealing plug structure 602*a* with a connecting tube 602*b*.

It is noted that the self-sealing plug structure 602/102 is for injecting a liquid metal into the sealed gap and the storage-tube according to the method described in conjunction with the drawings in FIG. 2 to FIG. 10. However, the usage of the self-sealing plug structure 602/102 is not limited for this purpose. It can also be used for venting air while injecting a liquid metal from the self-sealing plug structure 603*a* via the storage-tube 603*b* into the sealed gap without using a vacuum pump tool, which is simply described in FIG. 16 below.

Figure 16:
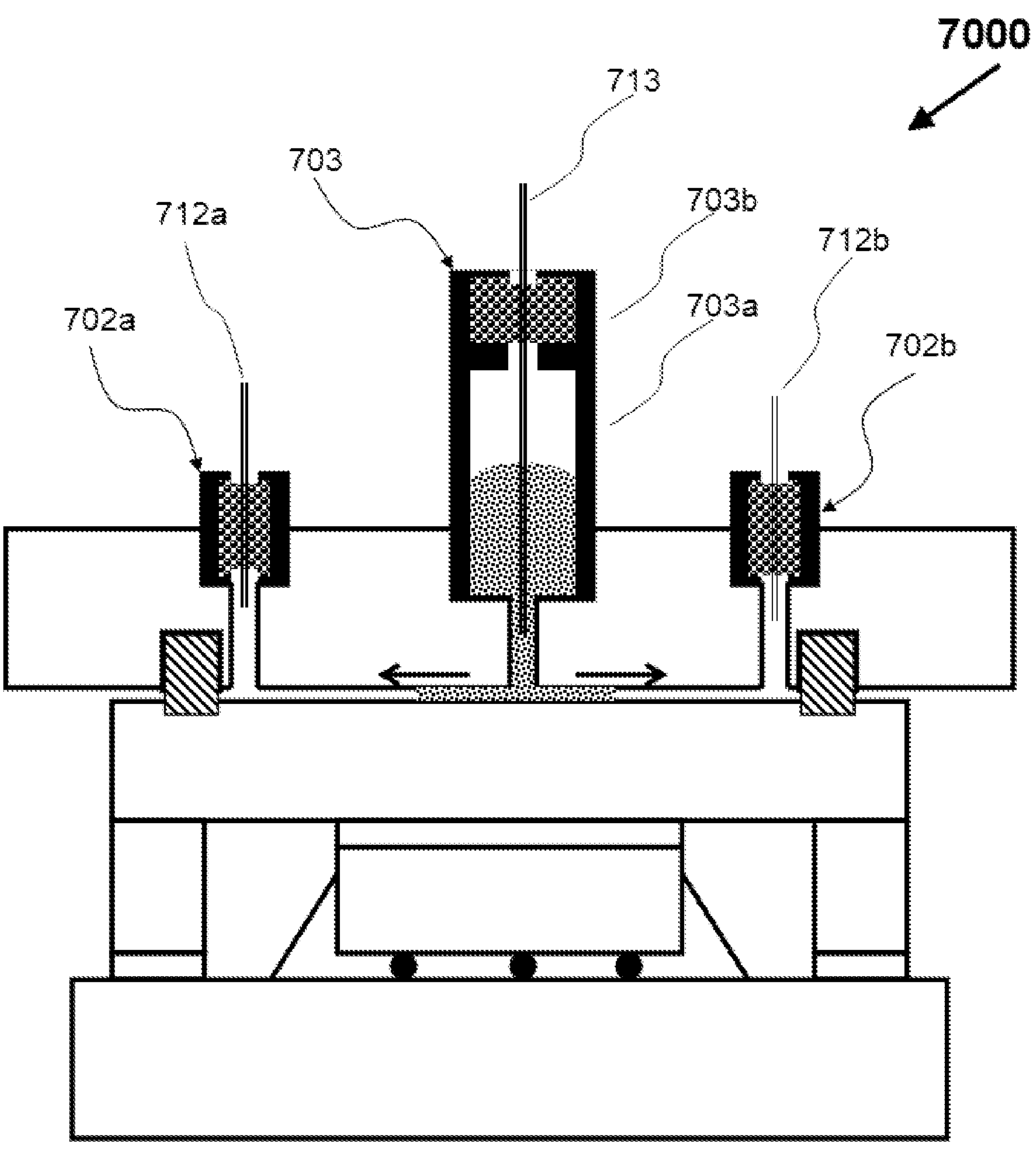
FIG. 16 is a schematic diagram for illustrating a heat dissipating object coupled with a storage-tube with a self-sealing plug structure and a plurality of self-sealing plug structures for venting air of another preferred embodiment of the present invention.

FIG. 16 is a schematic diagram for illustrating heat dissipating object coupled with a storage-tube with a self-sealing plug structure and a plurality of self-sealing plug structures for venting air of another preferred embodiment of the present invention. The numerical symbol 7000 in FIG. 16 designates a heat dissipating object allowing for a liquid metal TIM to transfer heat from a lidded flip chip package, in which the numerical symbol 703 designates a storage-tube 703*a* coupled with a self-sealing plug structure 703*b* at its outer end, 702*a* and 702*b* designate a plurality of self-sealing plug structures mounted at the base plate of the heat dissipating object, 713 designates a needle for injecting a liquid metal into the storage-tube 703*a* and into the sealed gap, and 712*a* and 712*b* designate needles corresponding to the self-sealing plug structures 702*a* and 702*b* for venting air during injecting the liquid metal into the sealed gap. It is noted that a needle 712*a* and/or 712*b* is removed once the liquid metal has reached it while injecting the liquid metal into the sealed gap. It is also noted that the heat dissipating object is relatively convenient for personal use when a vacuum pump tool is not available.

The spirit and scope of the present invention is to mount a self-sealing plug structure at the outer end of a storage-tube and another one or more self-sealing plug structures at the base plate of a heat dissipating object so that a liquid metal can be easily and safely filled into the sealed gap, and then isolated from the atmosphere by the self-sealing plug structures to avoid its oxidization. In an electronic system with a semiconductor chip as a heat-generating object, a heat-dissipating-object usually includes a heat sink, a cold plate, a vapor chamber, or a combination of these particular heat dissipating objects, like a heat sink coupled with a vapor chamber or vapor tubes. These heat-dissipating objects commonly include a base plate having a top and a bottom surface, and the bottom surface of the heat-dissipating objects contacts a top surface of the electronic device through a TIM for transferring heat from the electronic device to the heat dissipating objects, which then transmits heat to the ambient. According to the spirit and scope of the present invention, a heat-dissipating-object with a storage-tube as a reservoir and one or more self-sealing plug structures can be flexibly designed.

Although the present invention is described in some details for illustrative purpose with reference to the specific embodiments and drawings, it is apparent that many other modifications and variations may be made without departing from the spirit and scope of the present invention.

What is claimed is:

1. A heat-dissipating object allowing for a thermal interface material (TIM) with fluidity to transfer heat from an electronic device, comprising:

a base plate having a top surface, a bottom surface and one or more first self-sealing plug structures, a sealing ring, a liquid-storage tube having a second self-sealing plug structure, wherein the sealing ring is mounted at the bottom surface of the base plate, directly sealing a peripheral region of a top surface of the electronic device to provide a sealed gap between a portion of the bottom surface of the base plate and a portion of the top surface of the electronic device;

wherein each of the one or more first self-sealing plug structures of the base plate includes a first chamber and a first rubber block enclosed in the first chamber;

wherein the one or more first self-sealing plug structures of the base plate are positioned at the top surface of the base plate and connected to the sealed gap;

wherein the second self-sealing plug structure of the liquid-storage tube includes a second chamber and a second rubber block enclosed in the second chamber;

wherein the liquid-storage tube has two ends, one end is connected to the sealed gap, and its self-sealing plug structure is positioned at the other end; and wherein the sealed gap is entirely filled with a thermal interface material with fluidity, a portion of the liquid-storage tube is filled with the same thermal interface material, and the remaining portion of the liquid-storage tube is filled with a gas.

2. The heat-dissipating object of claim 1, wherein the heat-dissipating object has a ring-form of notch at its bottom surface, in which the seal ring is mounted.

3. The heat-dissipating object of claim 1, wherein the sealing ring is compressed between the bottom surface of the base plate and the top surface of the electronic device.

4. The heat-dissipating object of claim 1, wherein at least one or more of the first and second rubber blocks are larger than their corresponding chambers, and are compressed inside their corresponding chambers.

5. The heat-dissipating object of claim 1, wherein at least one or more of the first and second self-sealing plug structures consist of two cups.

6. The heat-dissipating object of claim 5, wherein the two cups are joined together through an adhesive or solder material, or through a screw connection.

7. The heat-dissipating object of claim 5, wherein the two cups are joined together through an adhesive or solder material, or through a screw connection, and a piston is also enclosed inside the two cups besides the rubber block.

8. The heat-dissipating object of claim 1, wherein at least one or more of the first and second self-sealing plug structures consist of a cup with a piston.

9. The heat-dissipating object of claim 1, wherein each of the first and second chambers includes two holes, one at its top side and the other at its bottom side.

10. The heat-dissipating object of claim 9, wherein a drop of adhesive or glue is placed in the hole at the top side of each of all the chambers.

11. The heat-dissipating object of claim 1, wherein the liquid-storage tube is a folding-form of tube.

12. The heat-dissipating object of claim 1, wherein the heat-dissipating object is a heat sink, a cold plate or a vapor chamber.

13. The heat-dissipating object of claim 1, wherein the thermal interface material with fluidity is a liquid metal, including gallium and gallium alloy.

14. The heat-dissipating object of claim 1, wherein the electronic device is a flip chip package, including a flip chip attached on a substrate, the flip chip has a top surface, a bottom surface and four sides, the top surface of the flip chip is the top surface of the electronic device, and the seal ring directly seals a peripheral edge region at the top surface of the flip chip.

15. The heat-dissipating object of claim 14, wherein the seal ring also seals the sides of the flip chip and a portion of the top surface of the substrate surrounding the sides of the flip chip.

16. The heat-dissipating object of claim 1, wherein the electronic device is a lidded flip chip package, including a flip chip package covered with a lid, the top surface of the lid is the top surface of the electronic device, and the seal ring directly seals a peripheral region at the top surface of the lid.

17. The heat-dissipating object of claim 16, wherein the lid includes a ring-form of notch at a peripheral region of a top surface of the lid, and the seal ring is placed in the ring-form of notch.

18. The heat-dissipating object of claim 1, wherein the thermal interface material with fluidity is formed by a method, which mainly comprises the following steps:

1) Mount the heat dissipating object onto the electronic device;
2) Insert a needle of a vacuum pump tool through the self-sealing plug structure integrated with the liquid-storage tube, and insert a needle of a liquid dispenser through the self-sealing plug structure integrated with the base plate;
3) Switch the vacuum pump tool to its vacuum condition to completely pump out the air in the space between the heat-dissipating object and the electronic device, including that in the sealed gap and the liquid-storage tube;
4) Push a piston of the liquid dispenser to inject the thermal interface material with fluidity into the sealed gap and a portion of the liquid-storage tube, and then remove the needle of the liquid dispenser;
5) Switch the vacuum pump tool to its gas filling condition to fill a gas into the remaining portion of the liquid-storage tube, and then remove the needle of the vacuum pump tool.

* * * * *